United States Patent
Hsiao et al.

(12)

(10) Patent No.: US 6,231,367 B1
(45) Date of Patent: May 15, 2001

(54) METHOD FOR ACHIEVING SUBSTANTIALLY UNIFORM EXPANSION OF DIELECTRIC PLATE AND ELECTRICAL CONNECTOR MADE IN ACCORDANCE THEREWITH

(75) Inventors: Shihwei Hsiao, Tu-Chen; Ming-Lun Szu, Taipei, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/490,861

(22) Filed: Jan. 24, 2000

Related U.S. Application Data

(62) Division of application No. 09/365,615, filed on Aug. 2, 1999, now Pat. No. 6,042,413.

(30) Foreign Application Priority Data

Dec. 31, 1998 (TW) .................................................. 87121984

(51) Int. Cl.$^7$ .................................................. H01R 13/625
(52) U.S. Cl. .................................. 439/342; 439/70; 439/83
(58) Field of Search .................................. 439/70–73, 83, 439/876, 331, 342

(56) References Cited

U.S. PATENT DOCUMENTS 4,555,157 * 11/1985 Johnson et al. ...................... 439/331

* cited by examiner

Primary Examiner—Gary F. Paumen
(74) Attorney, Agent, or Firm—Wei Te Chung

(57) ABSTRACT

An electrical connector includes a dielectric base plate in which steel and copper strips are embedded. The steel and copper strips are respectively arranged in opposite sides of the base plate substantially perpendicular to and interconnected to each other whereby when the base is subject to a heating process, the steel and copper strips limit and control thermal expansion in different directions of the base plate and reduce differences in thermal expansion between the base plate and a circuit board to which the connector is mounted. Furthermore, a method for achieving substantially uniform thermal expansion of a dielectric plate is also provided and comprises the steps of (1) providing a dielectric plate made by injection molding and (2) fixing steel and copper strips thereto for limiting and controlling the expansion of the plate in different directions to achieve substantially uniform thermal expansion of the plate.

2 Claims, 8 Drawing Sheets

METHOD FOR ACHIEVING SUBSTANTIALLY UNIFORM EXPANSION OF DIELECTRIC PLATE AND ELECTRICAL CONNECTOR MADE IN ACCORDANCE THEREWITH

This is a divisional application of the application Ser. No. 09/365,615 filed Aug. 2, 1999 now U.S. Pat. No. 6,042,413.

BACKGROUND OF THE INVENTION

1. Field of the Invention

The present invention generally relates to a method for achieving uniform expansion of a dielectric plate and an electric connector made in accordance therewith.

2. The Prior Art

A computer central processing unit (CPU) is mounted to a main computer board by means of a connector. Conventionally, the CPU connector has contacts extending beyond top and bottom faces thereof for electrical engagement with pins of the CPU and conductive traces of the main board. The contacts are soldered to the main board by a through hole technique. Such a connector structure occupies a substantial amount of space on the main board and requires a sophisticated process to mount the connector thereto.

A ball grid array (BGA) connector effectively overcomes the problems discussed above. As shown in FIG. 8 of the attached drawings, a BGA connector 8 comprises a dielectric base plate 83 defining a number of contact receiving passages 80 therein between top and bottom faces thereof for receiving and retaining conductive contacts 81. Each contact 81 has a solder support section 82 extending beyond the bottom face of the base plate 83. A solder ball 9 is attached to the solder support section 82 by heating the solder support section 82 in advance. The solder balls 9 may be molten and fixed to a circuit board (not shown) by a heating process which provides an efficient and effective way for soldering the connector 8 to the circuit board.

Since the base plate 82 of the connector 8 and the circuit board are generally made of different material having different thermal expansion coefficients, heating the solder balls 9 to fix the contacts 81 to the circuit board will result in different amounts of thermal expansion of the circuit board and the base plate 83 leading to an undesired strain induced in the solder balls 9.

Furthermore, the base plate 83 is usually made by injection molding. During the molding process, a plasticized dielectric material is injected into a mold. Due to the complicated configuration of the base, a non-uniform distribution of the molecules of the dielectric material will result leading to different thermal expansion coefficients in different directions of the base plate 83 when the base plate 83 is heated during a BGA soldering process. Such non-uniform thermal properties magnify the above problem.

Thus, it is desired to provide a method for achieving substantially uniform thermal expansion of a dielectric plate in order to alleviate the problems discussed above.

SUMMARY OF THE INVENTION

Accordingly, an object of the present invention is to provide a method for achieving substantially uniform thermal expansion of a dielectric plate.

Another object of the present invention is to provide a method for achieving substantially uniform thermal expansion between a connector and a circuit board to which the connector is mounted.

A further object of the present invention is to provide a base plate of a connector which has substantially uniform thermal expansion properties.

A still further object of the present invention is to provide an electrical connector having a base that has substantially uniform thermal expansion in different directions.

To achieve the above objects, an electrical connector includes a dielectric base plate in which steel and copper strips are embedded. The steel and copper strips are respectively arranged in opposite sides of the base plate and are substantially perpendicular to and interconnected to each other whereby when the base is subject to a heating process, the steel and copper strips limit and control thermal expansion in different directions of the base plate and reduce differences in thermal expansion between the base plate and a circuit board to which the connector is mounted.

Furthermore, a method for achieving substantially uniform thermal expansion of a dielectric plate is also provided. The method comprises the steps of (1) providing a dielectric plate made by injection molding and (2) fixing steel and copper strips thereto for limiting and controlling thermal expansion of the plate in different directions to achieve substantially uniform thermal expansion of the plate.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENTS

Figure 1:
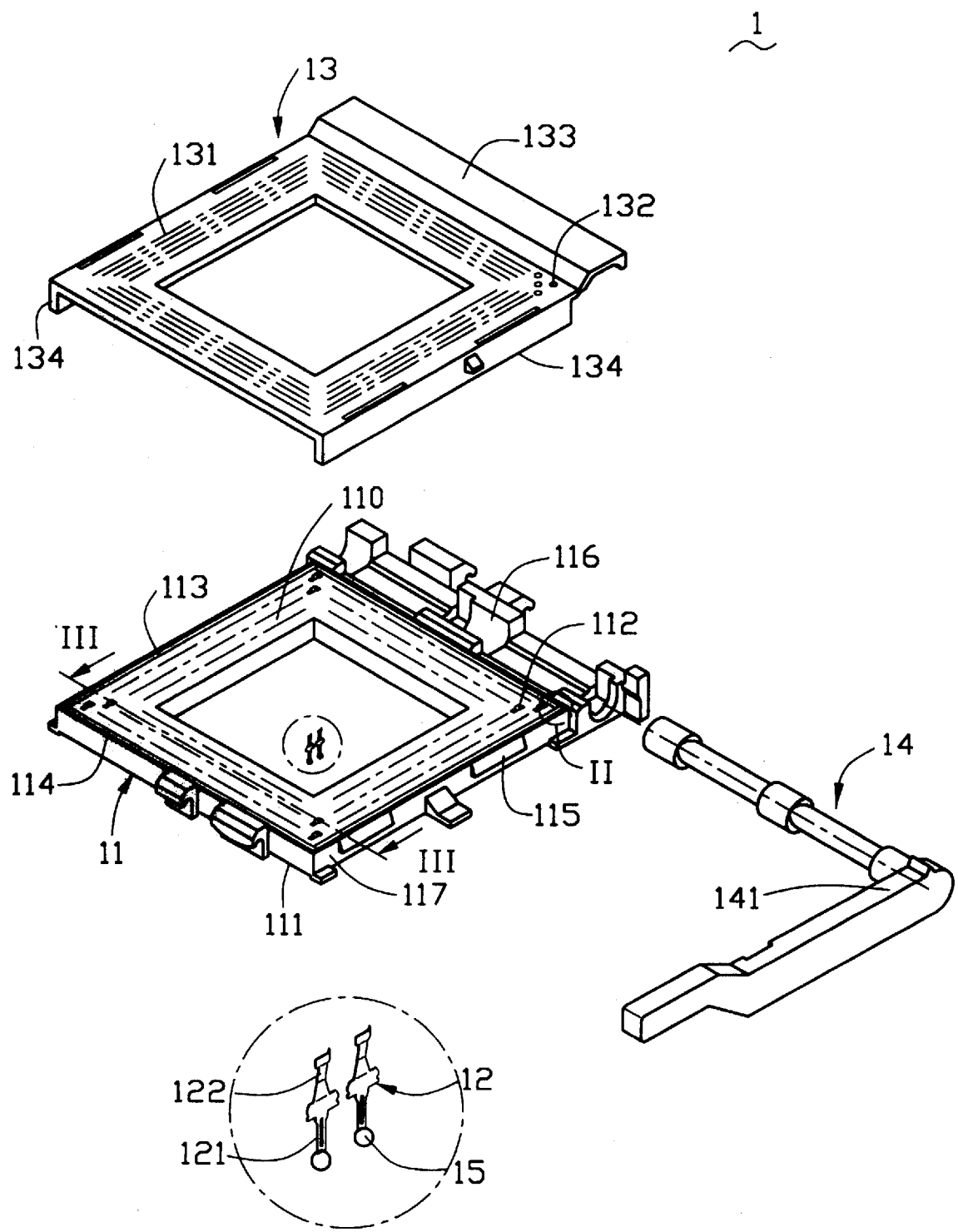
FIG. 1 is an exploded view of an electrical connector having a base plate constructed in accordance with a first embodiment of the present invention.
Figure 2:
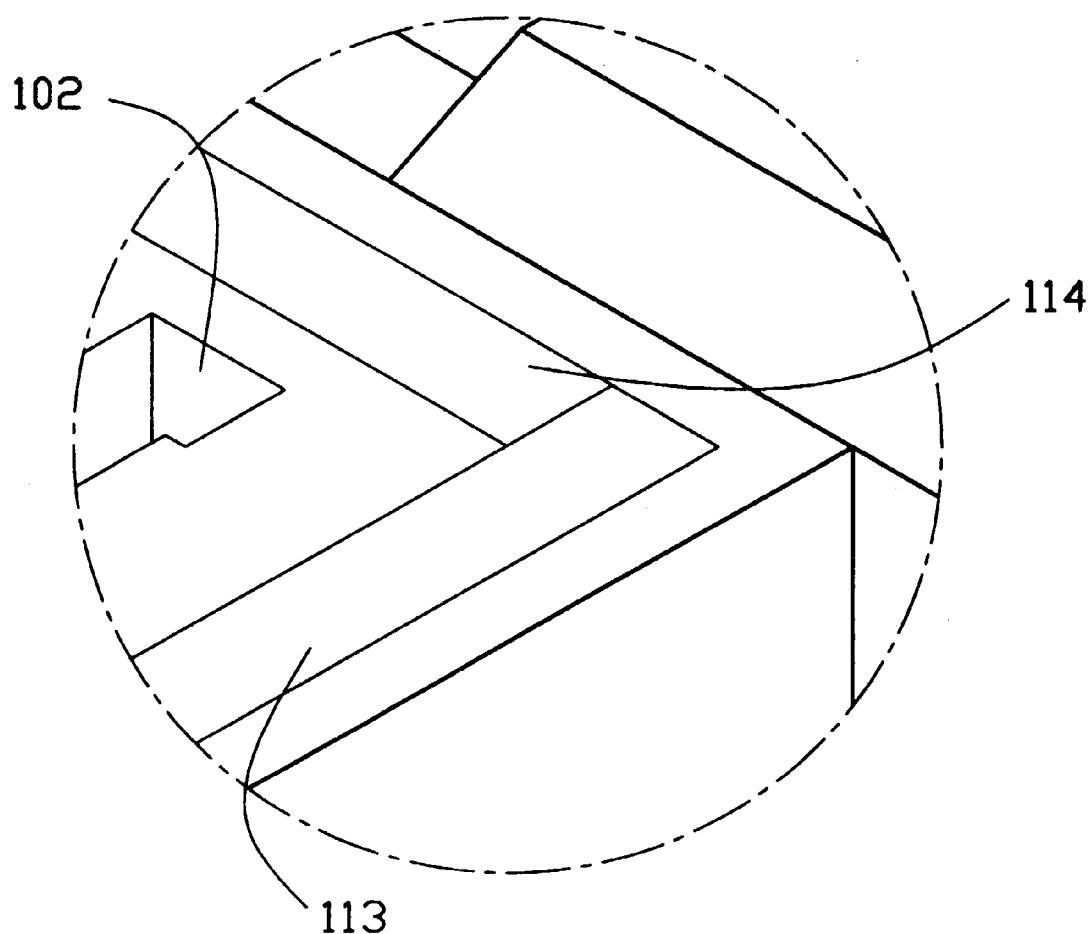
FIG. 2 is an enlarged view of encircled portion II of FIG. 1.
Figure 3:
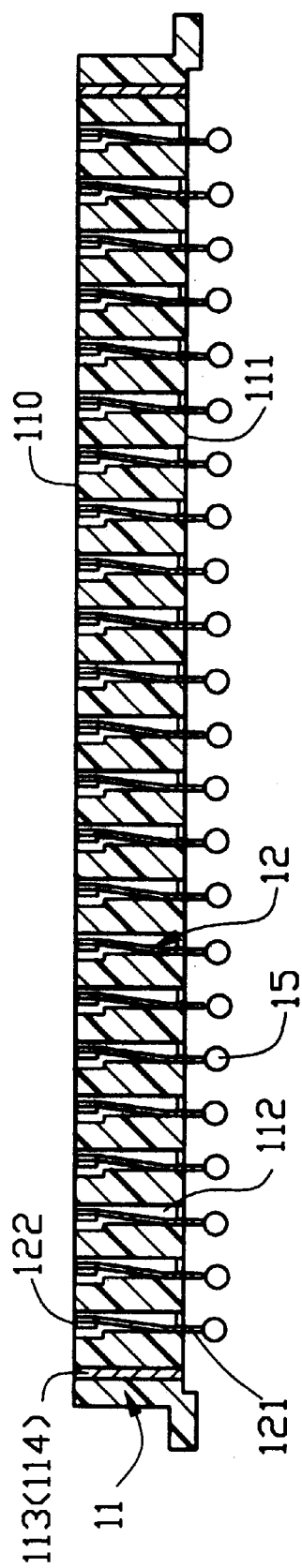
FIG. 3 is a cross-sectional view taken along line III—III of FIG. 1.

Referring to the drawings and in particular to FIGS. 1–3, an electrical connector 1 constructed in accordance with a first embodiment of the present invention comprises a rectangular base plate 11 defining a rectangular opening (not labeled) therein. The base plate 11 may be made of a liquid crystal polymer by means of injection molding. The base plate 11 has a top face 110 and an opposite bottom face 111. A plurality of contact receiving passages 112 is defined in the base plate 11 between the top and bottom faces 110, 111 for receiving and retaining conductive contacts 12 therein. Each contact 12 comprises a retention section 121 having a free end (not labeled) extending beyond the bottom face 111 with a solder ball 15 attached thereto, and an engaging section 122 for engaging with a corresponding pin of an electronic device (not shown), such as a central processing unit module.

A cover 13 comprises a central plate 131 movably supported on the base plate 11 for retaining the electronic device thereon. Flanges 134 extend from opposite edges of the central plate 131 for slidably and guidingly engaging with guide projections 115 formed on lateral faces 117 of the base plate 11. The central plate 131 defines a plurality of through holes 132 through which pins of the electronic device extend and partially enter the contact receiving passages 112 of the base plate 11.

An actuator 14 is rotatably received in receptacles 116 formed on the base plate 11 and retained therein by a flange 133 of the cover 13. The actuator 14 has a lever 141 for allowing a user to rotate the actuator 14 thereby causing a camming action on the cover 13 thereby moving the cover 13 with respect to the base plate 11 and engaging the pins of the electronic device with the contacts 12.

The base plate 11 is fixed to a circuit board (not shown) by heating the solder balls 15. When soldering the base plate 11 to the circuit board, the base plate 11 is subject to a heating process which causes thermal expansion of the base plate 11. Due to non-uniform molecular distribution in the base plate 11, the base plate 11 has different thermal expansion coefficients in different directions thereby being subject to different amounts of thermal expansion in different directions which causes an undesired strain of the solder balls 15.

To overcome such a problem, two pairs of elongate metallic strips 113, 114 are embedded in and integrated with the base plate 11 during the injection molding process. Each pair of metallic strips 113, 114 is arranged on opposite sides of the base plate 11 and is co-extensive with edges of the base plate 11. The metallic strips 113, 114 are made of metals having different thermal expansion coefficients that are also different from the thermal expansion coefficient of the base plate 11 whereby when the base plate 11 and the metallic strips 113, 114 are subject to heat during a soldering process, the metallic strips 113, 114, due to different amounts of thermal expansion, exert forces on the base plate 11 thereby limiting and controlling the thermal expansion of the base plate 11 in different directions to reduce the difference therebetween. This will be further discussed. If desired, the metallic strips 113, 114 may be interconnected together at free ends thereof as shown in FIG. 2.

Figure 4:
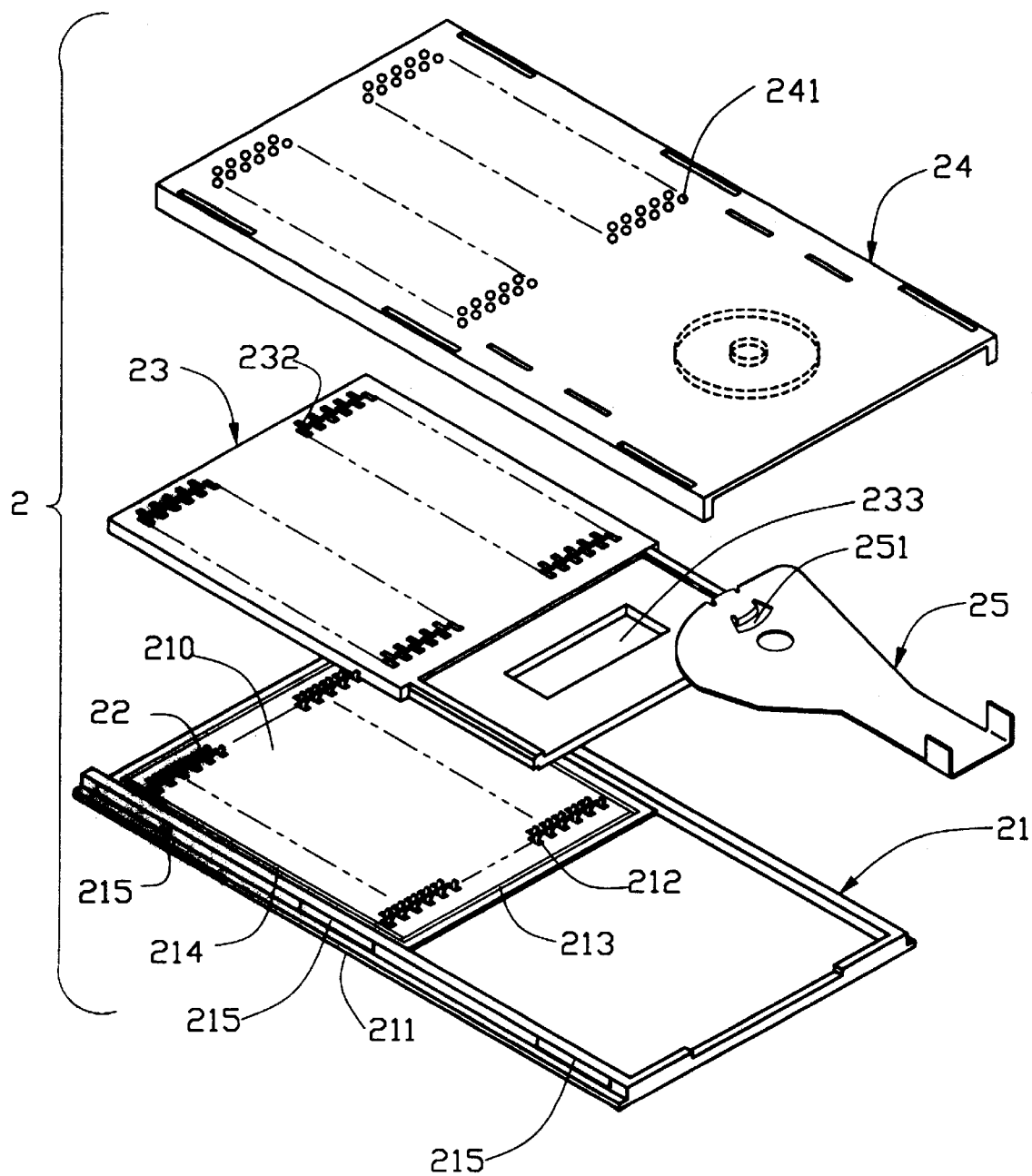
FIG. 4 is an exploded view of an electrical connector having a base plate constructed in accordance with a second embodiment of the present invention.

Referring to FIG. 4, an electrical connector 2 in accordance with a second embodiment of the present invention comprises a base plate 21 having a top face 210 and a bottom face 211 with contact receiving passages 212 defined therebetween for receiving and retaining conductive contacts 22. A cover 24 is mounted to the base plate 21 by side projections 215 formed on the base plate 21 for retaining an electronic device (not shown), such as a central processing unit module, thereon. A space is defined between the cover 24 and the base plate 21 for slidably receiving a slide board 23 therein. The cover 24 defines through holes 241 therein for receiving pins of the electronic device. The slide board 23 defines bores 232 therein for receiving and retaining conductive members (not shown). An actuator 25 is pivotally attached between the cover 24 and the base plate 21 and has a coupling section 251 engaging with an opening 233 defined in the slide board 23 whereby when the actuator 25 is manually rotated, the slide board 23 is moved with respect to the base plate 21 and the cover 24. The contacts 22 and the pins of the electronic device are partially received in the corresponding bores 232 of the slide board 23 whereby the movement of the slide board 23 engages the conductive members thereof with the corresponding pins of the electronic device and the contacts 22 and establishes electrical connection therebetween.

Similar to the first embodiment illustrated in FIGS. 1–3, two pairs of metallic strips 213, 214 are embedded in the base plate 21, respectively on opposite sides thereof, for reducing differences of thermal expansion of the base plate 21 in different directions. Experimental data shows that the base plate 21 of the connector 2 made of a liquid crystalline polymer without metallic strips 213, 214 embedded therein has a thermal expansion coefficient in a direction transverse to the movement of the slide board 23, which will be hereinafter referred to as X-direction, different from that in a direction parallel to the movement of the slide board 23, which will be referred to as Y-direction. For the example shown, the X-direction thermal expansion coefficient ($\bullet_X$) of the base plate 21 is equal to $50 \times 10^{-6}$ mm/mm·° C. and the Y-direction thermal expansion coefficient ($\bullet_Y$) is $5 \times 10^{-6}$ mm/mm·° C.

To reduce the difference between $\bullet_X$ and $\bullet_Y$, the metallic strips 213 are made of steel having a thermal expansion coefficient $\bullet_S = 12 \times 10^{-6}$ mm/mm·° C., and the metallic strips 214 are made of copper having a thermal expansion coefficient $\bullet_C = 17 \times 10^{-6}$ mm/mm·° C. With the metallic strips 213, 214 embedded in the base 11, the thermal expansion coefficient of the base 11 in the X- and Y-directions are changed to $\bullet_X = 25 \times 10^{-6}$ mm/mm·° C. and $\bullet_Y = 16 \times 10^{-6}$ mm/mm·° C.

The metallic strips 213 decrease the X-direction thermal expansion coefficient while the metallic strips 214 increase the Y-direction thermal expansion coefficient thereby reducing the difference therebetween.

Furthermore, it is to be noted that the thermal expansion coefficient for a typical circuit board is $17-20 \times 10^{-6}$ mm/mm·° C. The base plate 21 with the metallic strips 213, 214 embedded therein has thermal expansion coefficients in both the X- and Y-directions approximately equal to that of the circuit board. Therefore, a strain induced in the solder balls due to different thermal expansions between the base 21 and the circuit board can be minimized.

Figure 5:
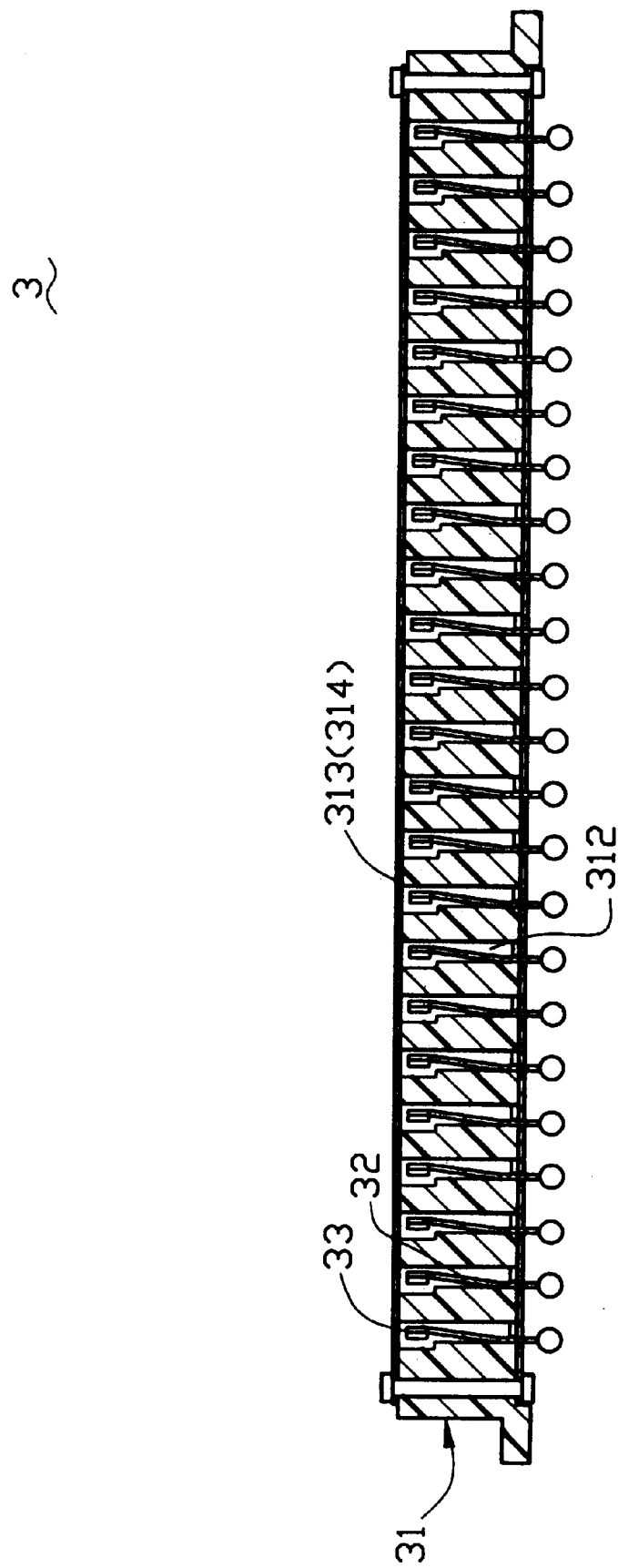
FIG. 5 is a cross-sectional view of a base plate of an electrical connector constructed in accordance with a third embodiment of the present invention.

FIG. 5 shows a base plate 31 of an electrical connector 3 constructed in accordance with a third embodiment of the present invention. The base plate 31 defines a plurality of the contact receiving passages 312 between top and bottom faces thereof for receiving and retaining conductive contacts 32 therein. First and second metallic strips 313, 314 are mounted to at least one of the top and bottom faces of the base plate 31 and are arranged on opposite sides of the base plate 31. Preferably, the metallic strips 313, 314 are mounted to both top and bottom faces of the base plate 31. Fasteners 33 secure the metallic strips 313, 314 to the base plate 31. Similar to the first and second embodiments described above, the metallic strips 313, 314 limit and control thermal expansion of the base plate 31 in different directions thereby reducing the difference between the X- and Y-direction thermal expansion thereof.

Figure 6:
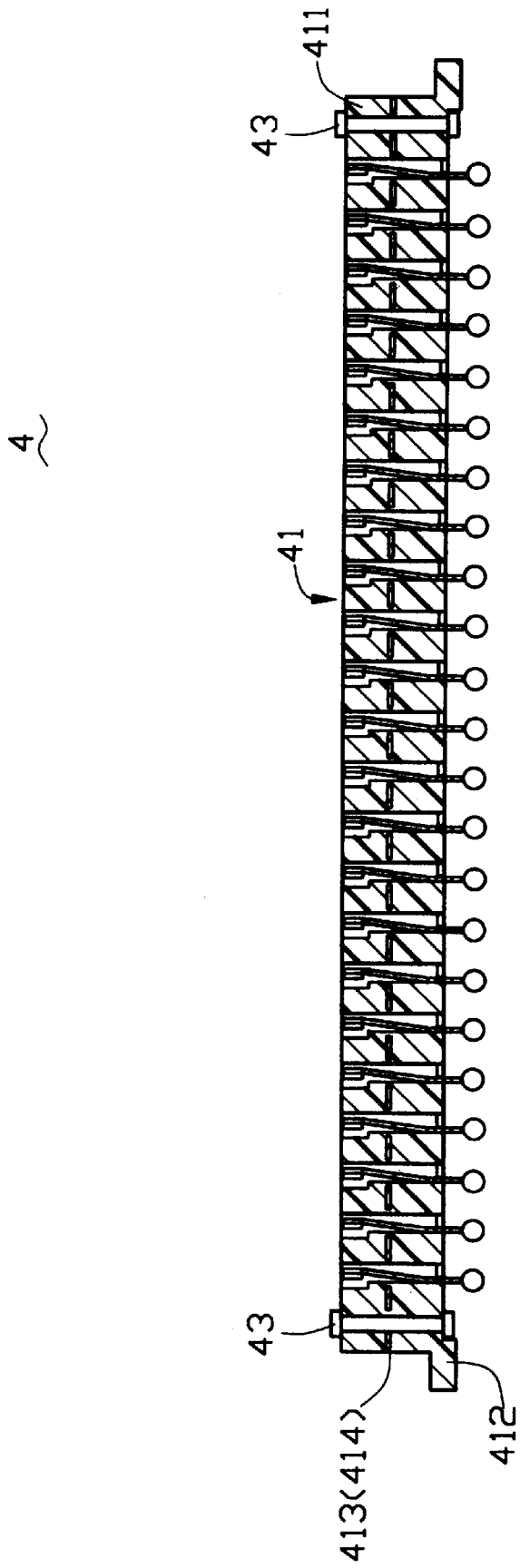
FIG. 6 is a cross-sectional view of a base plate of an electrical connector constructed in accordance with a fourth embodiment of the present invention.

FIG. 6 shows a base plate 41 of an electrical connector 4 constructed in accordance with a fourth embodiment of the present invention. The base plate 41 comprises an upper portion 411 and a lower potion 412 with first and second metallic strips 413, 414 sandwiched therebetween. The first and second metallic strips 413, 414 are arranged on opposite sides of the base 41. Fasteners 43 secure the upper and lower portions 411, 412 and the metallic strips 413, 414 together. Similar to the previous embodiments, the metallic strips 413, 414 limit and control thermal expansion of the base 41, especially the lower portion 412, thereby reducing the difference between the X- and Y-direction thermal expansion thereof.

Figure 7:
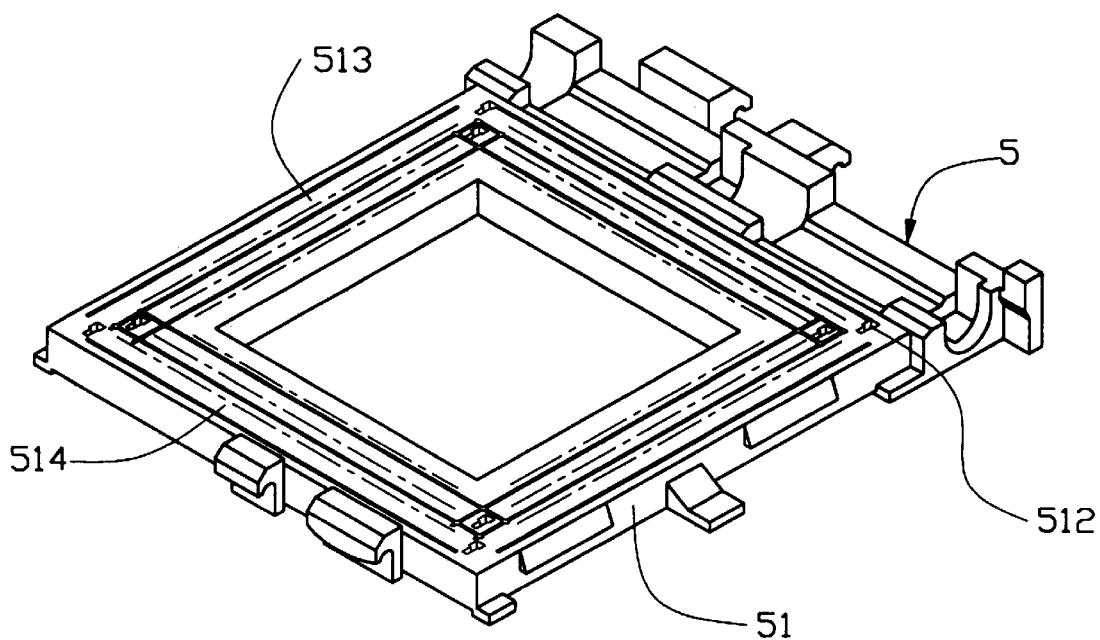
FIG. 7 is a perspective view of a base plate of an electrical connector constructed in accordance with a fifth embodiment of the present invention.
Figure 8:
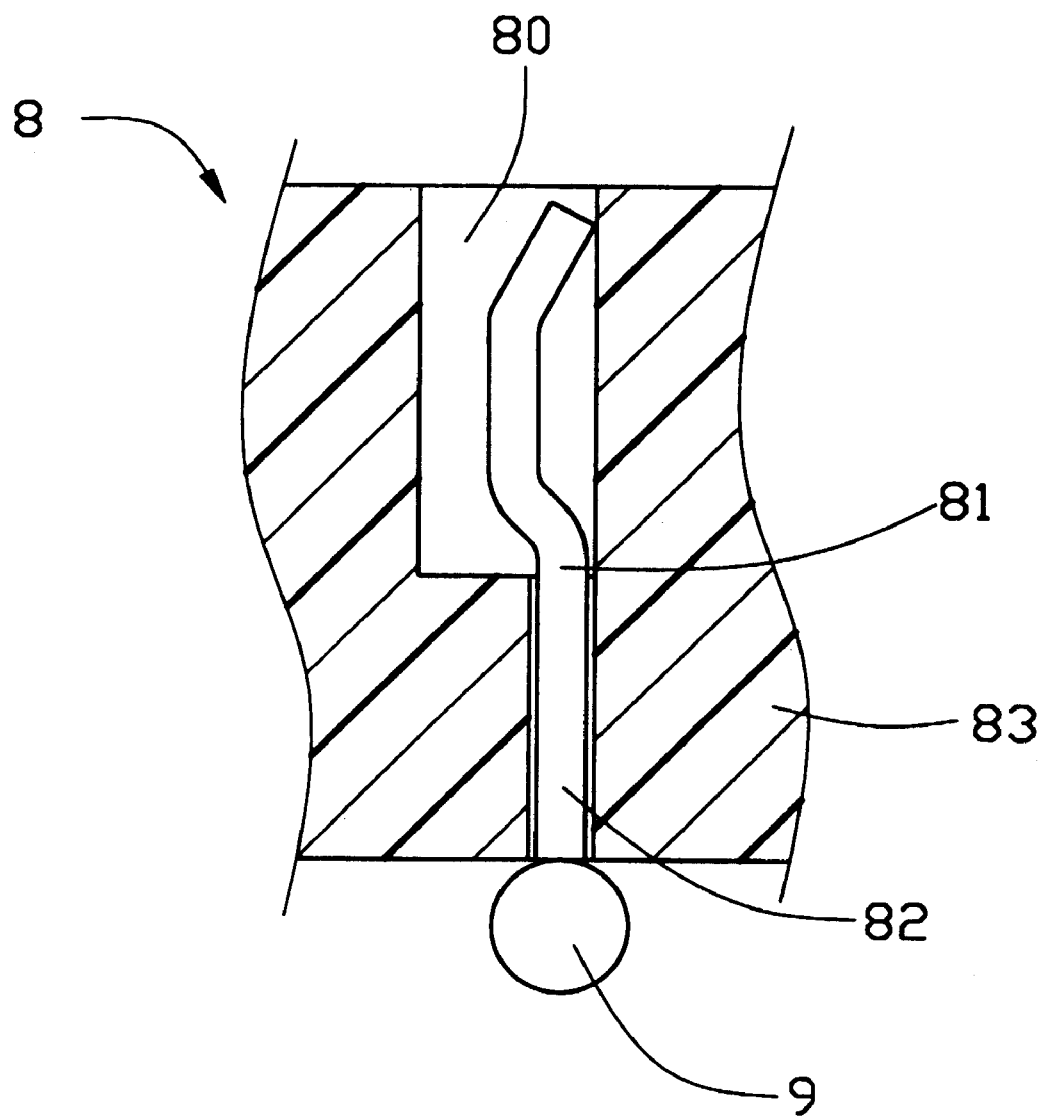
FIG. 8 is a cross-sectional view of a portion of a conventional electrical connector.

FIG. 7 shows a base plate 51 of an electrical connector 5 constructed in accordance with a fifth embodiment of the present invention. The base plate 51 defines a plurality of the contact receiving passages 512 for receiving and retaining conductive contacts (not shown) therein. More than one pair of first metallic strips 513 is embedded in the base plate 51 and arranged on opposite sides thereof substantially parallel to each other in the X-direction. More than one pair of second metallic strips 514 is embedded in the base plate 51 and arranged on opposite sides thereof substantially parallel to each other in the Y-direction and perpendicular to the first metallic strips 513. At least some of the first and second metallic strips 513, 514 are interconnected together. Similar to the previous embodiments, the metallic strips 313, 314 limit and control the thermal expansion of the base plate 51 thereby reducing the difference between the X- and Y-direction thermal expansion thereof. Furthermore, since there are more strips 513, 514 embedded in the base plate 51 and distributed in a uniform manner, the electrical connector 5 is more effective in controlling thermal expansion than the previously described embodiments of the present invention.

In view of the above description of the several preferred embodiments of the present invention, a method for achieving substantially uniform thermal expansion of a dielectric plate comprises the steps of (1) providing a dielectric plate; and (2) securely fixing first and second elongate members to the plate. The first and second elongate members are made of material having different thermal expansion coefficients that are also different from the thermal expansion coefficient of the plate. The first and second elongate members are arranged in first and second directions, respectively. The first and second directions are not parallel to each other whereby when the plate is subject to a heating process, the first and second elongate members limit and control thermal expansion of the plate in the first and second directions thereby achieving substantially uniform expansion of the plate.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An electrical connector comprising a plate-like body having a top face and an opposite bottom face adapted to be mounted to a circuit board by means of soldering, the body having first and second thermal expansion coefficients in first and second directions thereof, and at least two first elongate members and two second elongate members respectively having third and fourth thermal expansion coefficients different from each other, the first and second elongate members being mounted to at least one of the faces of the body respectively on opposite sides of the body in first and second directions with the first and second elongate members being substantially normal to each other whereby when the body is subject to a heating process and expands, the first and second elongate members limit and control thermal expansion of the body in the first and second directions to be substantially equal to each other.

2. The electrical connector as claimed in claim 1, wherein the body is made of liquid crystal polymer, and wherein the first and second elongate members are respectively made of steel and copper.

* * * * *